United States Patent
Renaldo et al.

(10) Patent No.: US 9,755,021 B2
(45) Date of Patent: Sep. 5, 2017

(54) INTEGRATED MULTICHANNEL AND SINGLE CHANNEL DEVICE STRUCTURE AND METHOD OF MAKING THE SAME

(71) Applicants: Karen M. Renaldo, Pasadena, MD (US); Eric J. Stewart, Silver Spring, MD (US); Robert S. Howell, Silver Spring, MD (US); Howell George Henry, Ellicott City, MD (US); Harlan Carl Cramer, Columbia, MD (US); Justin Andrew Parke, Ellicott City, MD (US); Matthew Russell King, Linthicum, MD (US)

(72) Inventors: Karen M. Renaldo, Pasadena, MD (US); Eric J. Stewart, Silver Spring, MD (US); Robert S. Howell, Silver Spring, MD (US); Howell George Henry, Ellicott City, MD (US); Harlan Carl Cramer, Columbia, MD (US); Justin Andrew Parke, Ellicott City, MD (US); Matthew Russell King, Linthicum, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/186,193

(22) Filed: Jun. 17, 2016

(65) Prior Publication Data
US 2016/0315152 A1 Oct. 27, 2016

Related U.S. Application Data

(62) Division of application No. 14/458,906, filed on Aug. 13, 2014, now Pat. No. 9,385,224.

(51) Int. Cl.
*H01L 29/66* (2006.01)
*H01L 29/15* (2006.01)
(Continued)

(52) U.S. Cl.
CPC ........ H01L 29/155 (2013.01); H01L 21/0254 (2013.01); H01L 21/302 (2013.01);
(Continued)

(58) Field of Classification Search
CPC ............... H01L 29/66; H01L 29/42392; H01L 29/7783; H01L 29/7787
See application file for complete search history.

(56) References Cited

U.S. PATENT DOCUMENTS 5,541,424 A * 7/1996 Graber ................ H01L 27/0605
257/135
2008/0116485 A1* 5/2008 Hudait ................ H01L 21/8258
257/192
(Continued)

Primary Examiner — Phuc Dang
(74) Attorney, Agent, or Firm — Tarolli, Sundheim, Covell & Tummino LLP

(57) ABSTRACT

An integrated circuit is disclosed that includes a single channel device having a first portion of a single shared heterostructure overlying a substrate structure in a single channel device area, and a gate contact that is in contact with the first portion of the single shared heterostructure. The integrated circuit also includes a multichannel device comprising a second portion of the single shared heterostructure overlying the substrate structure in a multichannel device area, a barrier layer overlying the second portion of the single shared heterostructure, and a superlattice structure overlying the barrier layer, the superlattice structure comprising a plurality of heterostructures. An isolation region in the single shared heterostructure electrical isolates the single channel device from the multichannel device.

20 Claims, 15 Drawing Sheets

(51) Int. Cl.
    *H01L 29/778* (2006.01)
    *H01L 21/02* (2006.01)
    *H01L 21/76* (2006.01)
    *H01L 29/06* (2006.01)
    *H01L 21/302* (2006.01)
    *H01L 29/423* (2006.01)
    *H01L 29/20* (2006.01)
    *H01L 21/8252* (2006.01)
    *H01L 27/06* (2006.01)
    *H01L 27/085* (2006.01)
    *H01L 21/3065* (2006.01)
    *H01L 21/768* (2006.01)
    *H01L 29/205* (2006.01)
    *H01L 29/417* (2006.01)
    *H01L 29/51* (2006.01)

(52) U.S. Cl.
    CPC ...... *H01L 21/3065* (2013.01); *H01L 21/7605* (2013.01); *H01L 21/76877* (2013.01); *H01L 21/8252* (2013.01); *H01L 27/0605* (2013.01); *H01L 27/085* (2013.01); *H01L 29/0642* (2013.01); *H01L 29/0649* (2013.01); *H01L 29/2003* (2013.01); *H01L 29/205* (2013.01); *H01L 29/41725* (2013.01); *H01L 29/42316* (2013.01); *H01L 29/66431* (2013.01); *H01L 29/66462* (2013.01); *H01L 29/7783* (2013.01); *H01L 29/518* (2013.01)

(56) References Cited

U.S. PATENT DOCUMENTS

| | | | |
|---|---|---|---|
| 2008/0169474 A1* | 7/2008 | Sheppard | H01L 21/8213 257/76 |
| 2010/0072517 A1* | 3/2010 | Zampardi | H01L 27/0605 257/197 |
| 2010/0117118 A1* | 5/2010 | Dabiran | H01L 29/207 257/190 |

* cited by examiner

US 9,755,021 B2

INTEGRATED MULTICHANNEL AND SINGLE CHANNEL DEVICE STRUCTURE AND METHOD OF MAKING THE SAME

RELATED APPLICATIONS

This application is a divisional of U.S. patent application Ser. No. 14/458,906, filed 13 Aug. 2014, now U.S. Pat. No. 9,385,224, issued on 5 Jul. 2016, which is incorporated herein in its entirety.

TECHNICAL FIELD

The present invention relates generally to electronics, and more particularly to an integrated multichannel and single channel device structure and method of making the same.

BACKGROUND

Certain heterostructure materials, such as Aluminum Gallium Nitride (AlGaN) and Gallium Nitride (GaN), create an electron well (i.e., a sheet of electrons) at the interface between the two dissimilar materials resulting from the piezoelectric effect and spontaneous polarization effect there between. The resulting sheet of electrons that forms at this interface is typically referred to as a Two-Dimensional Electron Gas ("2DEG") channel. Equally applicable is a superlattice structure having a plurality of two-dimensional hole gas (2DHG) channels. Both types of structures can be referred to as "2D×G channel(s)" devices. FETs that operate by generating and controlling the electrons in the 2D×G channel are conventionally referred to as high electron mobility transistors ("HEMTs").

By stacking a plurality of these two-material heterostructures, and with the addition of appropriate doping in the layers to maintain the presence of the 2D×G channels when stacking a plurality of heterostructure layers, the electron sheets are able to act in parallel, allowing for greater current flow through the superlattice device. When this type of FET is "on", the superlattice device has a lower on-resistance, relative to a single heterostructure-layer device, because the multiple 2DEG channels allow a proportionally higher current to flow between the source and drain, resulting in an overall reduction in on-resistance. This type of structure has been well suited for providing an ultra low channel resistance high frequency switch.

Although these multiple heterostructure-layer devices provide a superior ultra-low resistance high frequency switch, they are not as ideally suited for forming other devices, such as highly linear amplifiers or other devices that can be formed from a single heterostructure-layer structure. Therefore, multiple heterostructure-layer devices are typically formed on an integrated circuit (or first wafer), while the single layer devices are typically formed on a separate integrated circuit (or second wafer). The two different integrated circuits can be arranged on a printed circuit board or other circuit and coupled to one another via traces to form subassemblies, such as a transceiver or other multiple component assembly. This type of configuration can result in signal losses and power losses during the transferring of signals between one integrated circuit and the other.

SUMMARY

In one example, a method of forming an integrated multichannel device and single channel device structure is provided. The method comprises depositing a single shared heterostructure over a substrate structure, depositing a barrier layer over the single shared heterorstructure, forming a superlattice structure comprising a plurality of heterostructures over the barrier layer, and etching away a portion of superlattice structure over a single channel area to the barrier layer. The method further comprises etching away a portion of the barrier layer over the single channel area to expose a top surface of the single shared heterostructure over the single channel area, forming an isolation region on the single shared heterostructure to isolate the single channel area from a multichannel area to provide a single channel device electrically isolated from a multichannel device, and performing a FET fabrication process to form two FETs, one on the single channel, one on the multichannel. Some process steps may be shared (eg, isolation, ohmic) but others could be performed in two steps, one for each HFET. Castellated gates will be fabricated for both HFETs, using a gate contact fill process to form a first gate contact for the single channel device and a second gate contact for the multichannel device.

In another example, a method of forming an integrated circuit is provided. The method comprises depositing a single shared heterostructure over a substrate structure, the heterostructure being formed of an aluminum gallium nitride (AlGaN) layer overlying a gallium nitride (GaN) layer, depositing a barrier layer over the single shared heterostructure, forming a superlattice structure comprising a plurality of heterostructures over the barrier layer, such that each heterostructure is formed from an AlGaN layer overlying a GaN layer, and etching away a portion of superlattice structure over a single channel area to the barrier layer. The method further comprises etching away a portion of the barrier layer over the single channel area to expose a top surface of the single shared heterostructure over the single channel area, forming an isolation region on the single shared heterostructure to isolate the single channel area from a multichannel area to provide a single channel device electrically isolated from a multichannel device, and performing a gate contact fill process to form a first gate contact for the single channel device and a second gate contact for the multichannel device, wherein the first gate contact is one of planar gate contact and a second gate contact is a castellated gate contact.

In yet a further example, an integrated circuit is provided that includes a single channel device having a first portion of a single shared heterostructure overlying a substrate structure in a single channel device area, and a gate contact that is in contact with the first portion of the single shared heterostructure. The integrated circuit also includes a multichannel device comprising a second portion of the single shared heterostructure overlying the substrate structure in a multichannel device area, a barrier layer overlying the second portion of the single shared heterorstructure, and a superlattice structure overlying the barrier layer, the superlattice structure comprising a plurality of heterostructures. An isolation region in the single shared heterostructure electrically isolates the single channel device from the multichannel device.

In yet another further example, a method of forming an integrated multichannel device and single channel device structure is provided. The method comprises forming a superlattice structure comprising a plurality of heterostructures over a base structure, etching away a portion of superlattice structure over a single channel area to the base structure, depositing a spacer layer over the base structure in the single channel area, depositing a single heterostructure over the spacer layer, forming an isolation region to isolate the single channel area from a multichannel area to provide a single channel device electrically isolated from a multichannel device, and performing a gate contact fill process to form a first gate contact for the single channel device and a second gate contact for the multichannel device.

In yet another further example, an integrated circuit is provided comprising a single channel device overlying a substrate structure in a single channel device area with the single channel device having a single heterostructure, and a multichannel device overlying the substrate structure in a multichannel device area with the multichannel device having a superlattice structure, and a castellated gate contact that substantially surrounds three sides of one or more multichannel ridges formed in the superlattice structure. The integrated circuit further comprises an isolation region in the single shared heterostructure that electrical isolates the single channel device from the multichannel device, and source and drain contact regions formed on opposite sides of the gate contacts in both the single channel and multichannel device regions to create transistors in both regions.

DETAILED DESCRIPTION

Figure 1:
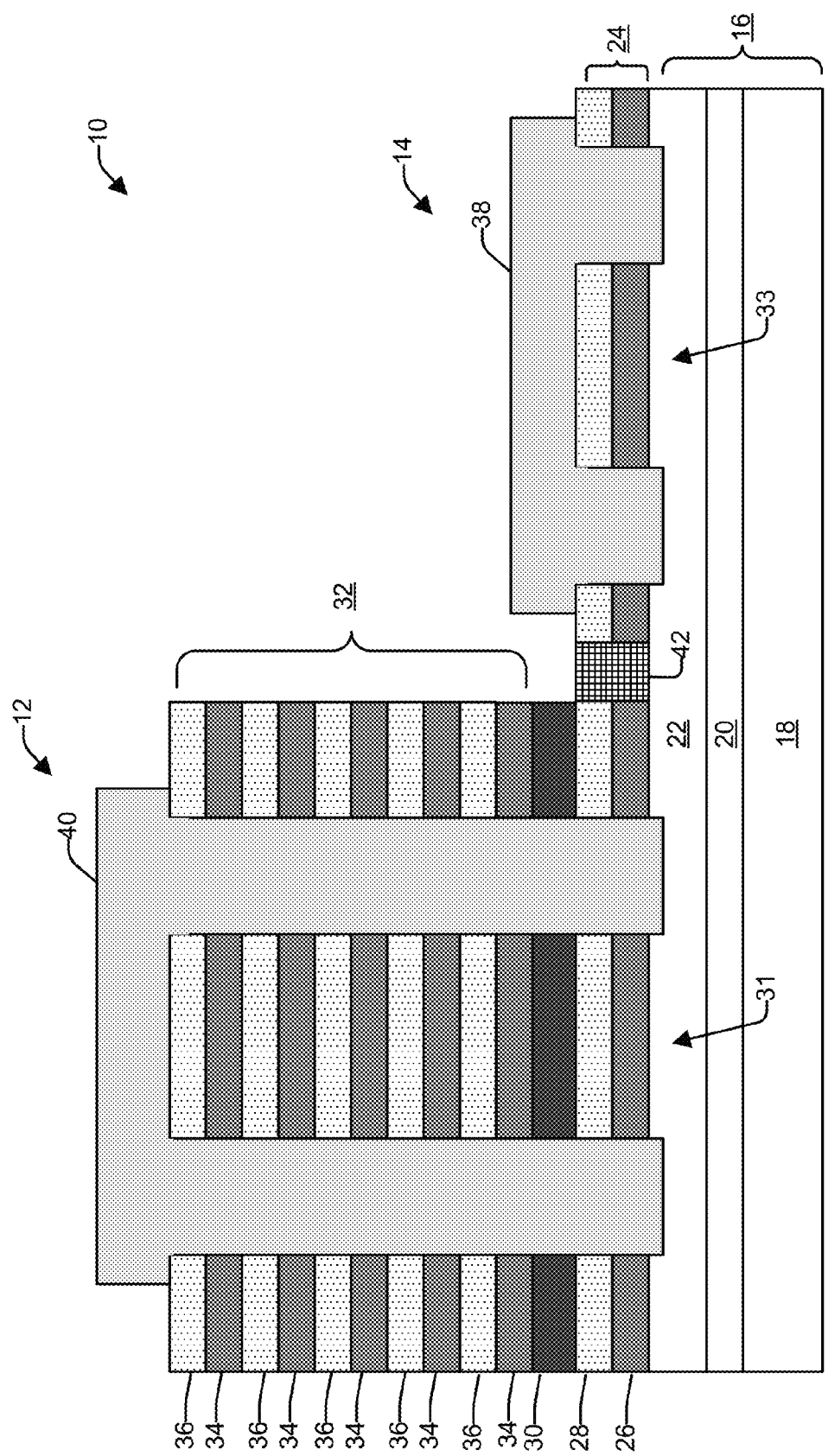
FIG. 1 illustrates an example of a cross-sectional view of an integrated multichannel and single channel device structure.

Integrated multichannel and single channel device structures are disclosed and methods of fabricating the same. The methods provide for integration of multichannel and single channel epitaxial devices on a single structure or wafer. To integrate a single channel epitaxial device with a multichannel epitaxial device, a set of epitaxial growth and etching techniques are disclosed to selectively remove material only in regions where this is desired. In one example, a barrier layer (e.g., etch stop layer, spacer layer) is employed to protect the single channel during formation of the single channel epitaxial device. The barrier layer can be removed over the single channel but left as part of the multichannel epitaxial device. The barrier layer can be selected based on thickness and/or material type to not affect or to affect the operation of a bottom channel of the multichannel epitaxial device. This present invention allows for integration and connectivity of multichannel and single channel devices and their associated functionality, for example, such as a high-linearity transmit and/or receive capability and low-loss switching on a single integrated circuit.

As an example, a multi-epitaxial gallium nitride field effect transistor (MEGaFET) structure described herein includes a single channel device composed of a single aluminum gallium nitride (AlGaN)/gallium nitride (GaN) heterojunction layer of a prescribed thickness and composition and a multichannel device composed of a plurality of AlGaN/GaN heterojunction layers of a prescribed thickness and composition, which is known as an AlGaN/GaN superlattice, formed on a single integrated circuit. A 2-dimensional electron gas (2DEG) forms at the interface between the AlGaN and GaN layers resulting in high electron mobility. Equally applicable is a superlattice structure having a plurality of two-dimensional hole gas (2DHG) channels. Both types of structures can be referred to as "2D×G channel(s)" devices. Simultaneous use of multichannel and single channel epitaxial devices, for example, provide for the ability to have high linearity FETs and low loss RF switches on a single device.

Example methods of integration involve sequential growth of single and multichannel profiles in a monolithic epitaxial scheme. By sequentially growing the epitaxial for both single channel and multichannel devices, all devices fabricated from this structure will benefit from the inherently high quality material properties, atomically flat interfaces and compositional control associated with epitaxial growth.

Carriers which form a 2DEG in a standard single channel AlGaN/GaN HFET are spontaneously generated and maintained due to piezoelectric and spontaneous polarization. In this case, the AlGaN barrier is strained by virtue of its epitaxial relationship with the GaN channel and since these materials are piezoelectric, free carriers are generated in the channel. In contrast, gallium arsenide (GaAs) and its aluminum based alloy AlGaAs can maintain a 2DEG; however, they are not significantly piezoelectric and therefore require doping to induce an appreciable 2DEG concentration. Since carrier concentration in AlGaN/GaN heterostructures is controlled largely by the strain state of barrier and channel layers, the present examples disclose that the MEGaFET structure can be created through precise control of composition, thickness and order of AlGaN and GaN layers. An epitaxial scheme and device fabrication method is provided that exploits this phenomenon which is unique to the GaN-based material system, and allows for integration of high linearity FETs and low loss RF switches.

Figure 2:
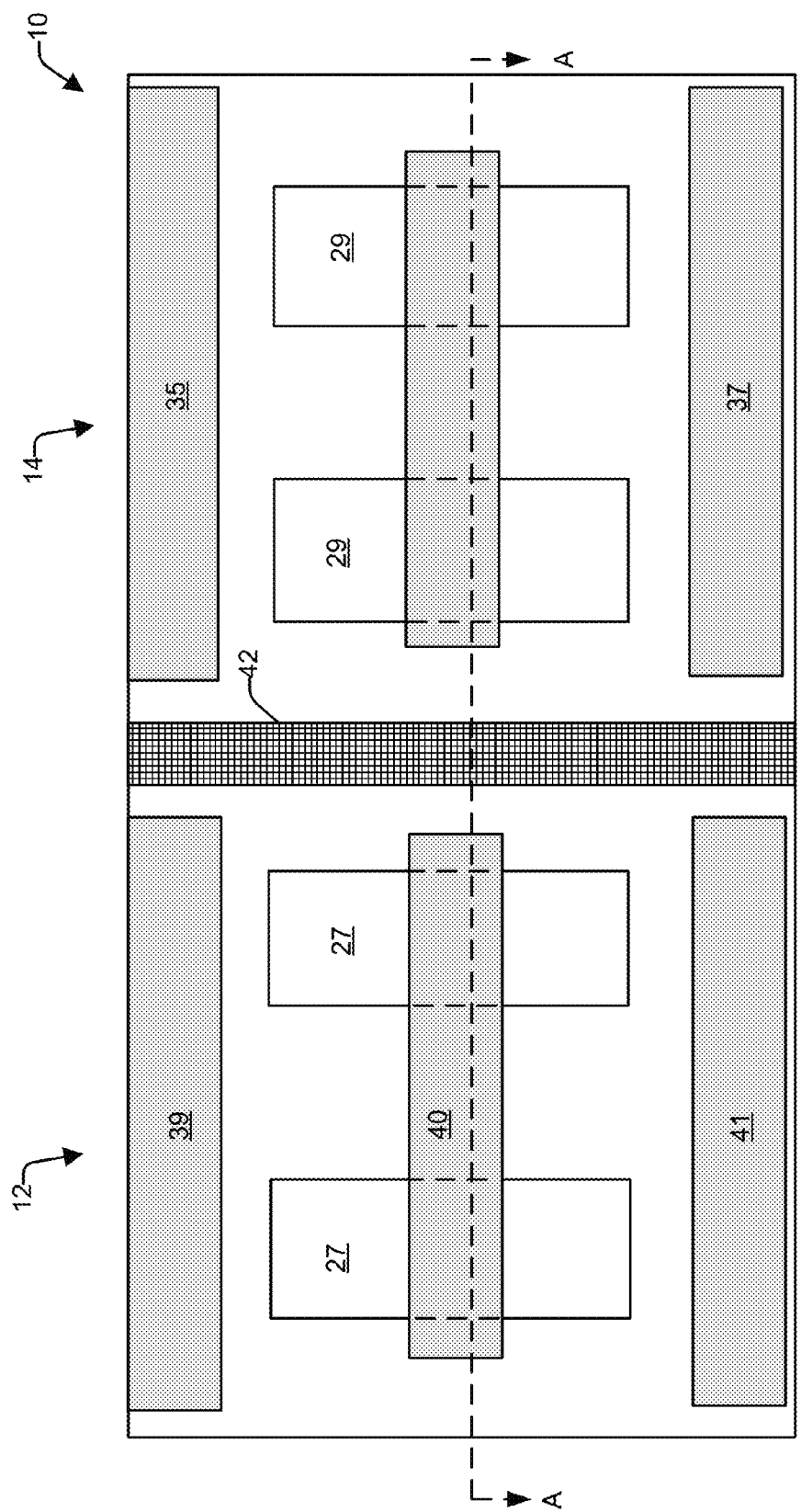
FIG. 2 illustrates another example of a cross-sectional view of an integrated multichannel and single channel device structure.

FIG. 2 illustrates a top plan view of an example of an integrated multichannel and single channel device structure 10. FIG. 1 illustrates a cross-sectional view of the integrated multichannel and single channel device structure 10 along lines A-A. The device structure 10 includes a multichannel device 12 adjacent an isolated from a single channel device 14 by an isolation region 42. The single channel device 14 includes a single shared heterostructure 24 of an AlGaN layer 28 overlying a GaN layer 26. The multichannel device 12 also includes the same single shared heterostructure structure 24 separated by the isolation region 42 and a superlattice structure 32 formed from plurality of heterostructures of AlGaN layers 36 overlying GaN layers 34, and separated from the single heterostructure 24 by a barrier layer 30 that is employed as an etch stop layer 30 during processing of the integrated multichannel and single channel device structure 10. The single shared heterostructure 24 portion of the multichannel device 12 operates as a first channel in conjunction with the five additional channels (e.g., channels 2-6) formed by the superlattice structure 32.

The etch stop layer 30 can be a relatively thin layer of aluminum nitride (AlN) having a thickness of about 1 nm to about 20 nm (e.g., about 5 nm to about 10 nm) or GaN having a thickness of about 50 nm to about 200 nm (e.g., about 100 nm) for functioning as an etch stop during processing, but also not effecting the functionality of the bottom most channel of the multichannel device 12 during operation. Each GaN layer 26 and 34 of the heterostructures can have a thickness of about 5 nm to about 20 nm (e.g., 10 nm) and each AlGaN layer 28 and 36 can have a thickness of about 5 nm to about 15 nm (e.g., 7 nm).

Although the present example is illustrated with respect to employing a layer of AlGaN overlying a layer of GaN for each heterostructure, a variety of heterostructures could be employed as long as the heterostructure comprises two layers of dissimilar materials designed to create a sheet of electrons (i.e. a 2DEG channel) or a sheet of holes (i.e., a 2DHG channel) at the interface between the two dissimilar materials. Various heterostructure materials are known to produce 2DEG and 2DHG channels at the interface therebetween, including but not limited to Aluminum Gallium Nitride (AlGaN) and Gallium Nitride (GaN), Aluminum Gallium Arsenide (AlGaAs) and Gallium Arsenide (GaAs), Indium Aluminum Nitride (InAlN) and Gallium Nitride (GaN), alloys of Silicon (Si) and Germanium (Ge), and noncentrosymmetric oxide heterojunction overlying a base structure.

The multichannel device 12 includes a castellated gate contact 40 that surrounds three sides of one or more multichannel ridges 31 (only one shown) defined by trenches or castellated openings 27 formed in a multichannel castellated channel region. The castellated gate contact 40 facilitates device on/off control and reduces the off voltage necessary to turn off the multichannel device 12. One example of a multichannel device with a castellated gate is illustrated in commonly owned U.S. patent application Ser. No. 13/802,747 filed on Mar. 14, 2013, entitled, "Superlattice Crenelated Gate Field Effect Transistor", the entire contents of which is incorporated herein. Although shown as completely filling the castellated openings in FIG. 1, the castellated gate contact 40 can be a layer that does not completely fill the castellated openings.

The single channel device 14 also includes a castellated gate contact 38 that surrounds three sides of one or more single channel ridges 33 (only one shown) defined by trenches or castellated openings 29 formed in a single channel castellated channel region. The castellated gate 38 can provide for an HFET with a Gm that is nearly constant as Vgs is changed across a large range. As such, the output third order intercept (OTOI) of the single channel device 14 can be made very large, far superior to conventional GaN HFETs. The gate contacts 38 and 40 can be made of a conventional contact material comprising layers of nickel and gold, as known in the art. Other gate contacts compositions will be apparent to those skilled in the art. The multichannel device 12 includes a drain contact 39 and a source contact 41 and the single channel device 14 includes a drain contact 35 and a source contact 37. An overlying passivation layer of the device 10 is not shown but can be made in subsequent processing steps.

The multichannel device 12 and the single channel device 14 overly a base structure 16. The base structure 16 can comprise a substrate layer 18, a nucleation layer 20 and a buffer layer 22 of, for example, silicon carbide (SiC), aluminum nitride (AlN) and aluminum gallium nitride (AlGaN), respectively. Optionally, the base structure 16 can comprise a substrate layer 18 of sapphire, a nucleation layer 20 comprising a combination of a low-temperature GaN layer and a high-temperature GaN layer, and a buffer layer 22 based on the material of the superlattice structure to be located thereon, if required. The base structure 18 can alternatively comprise a substrate layer of (111)-orientated crystalline silicon, a nucleation layer 20 comprising AlN and a buffer layer 22 comprising a series of discrete AlGaN layers (typically between two and eight layers), each discrete layer having a different aluminum composition. Other base structures will be apparent to those skilled in the art.

Although the superlattice structure 32 is illustrated as having 5 heterostructures, the superlattice structure 32 can comprise a plurality of heterostructures, between 2 and N, wherein N is defined as the maximum number of heterostructures that can be grown, deposited or otherwise formed on each other without cracking or other mechanical failure in the layers or 2DEG channels. As will be appreciated by one skilled in the art, the value of N is a function of the specific heterostructure materials and thickness of each layer. The specific number of heterostructures within the superlattice structure and the heteromaterials can vary, and the relative positions of AlGaN and GaN may be reversed, as will be appreciated by one skilled in the art.

The percentage of aluminum in the AlGaN layers of the single shared heterostructure 24 and the superlattice structure 32 can range from about 0.1 to 100 percent. For example, the percentage of aluminum in the AlGaN layers can be between about 20% and 100% aluminum-content aluminum gallium nitride. The AlGaN layers can be graded or non-graded. In one example embodiment, each AlGaN layer within the is graded, the term "graded" being used to denote the process of gradually changing the percentage of aluminum to its specified percentage, relative to the percentage of gallium, as known in the art.

During the deposition, growth or other formation process of each of AlGaN layers 28 and 36, a delta doping of an n-type dopant such as silicon (Si) can be added to the AlGaN material forming the AlGaN layers by introducing the dopant gas for a brief time interval, allowing the delta-doping for a confined thickness within the AlGaN layers to induce a 2DEG channel within each heterostructure. Similarly, a p-type dopant such as magnesium (Mg) would be introduced to induce a 2DHG channel in relevant heterostructures, as applicable. Other n-type and p-type dopants will be apparent to those skilled in the art. In one example, the delta-doping concentration is preferably between about $1E17$ cm$^{-3}$ and about $1E20$ cm$^{-3}$. Other delta-doping concentrations will be apparent to those skilled in the art.

It is to be appreciated that in a single heterostructure, the dissimilar materials cause an imbalance stress in the system which allows polarization and/or piezoelectric effects to induce carriers to form in a potential well formed by the heterostructure, i.e., to create a 2DxG channel. However, in a superlattice structure where multiple heterostructures are stacked on top of each other, all heterostructures beneath the top heterostructure will become balanced and carriers that would otherwise induce in those potential wells will not be induced. Adding a doping layer near the interface where the potential well is formed will act to induce the carriers into that potential well, replacing the effect that would have occurred but for the balancing effect of multiple symmetric heterostructures.

Figure 3:
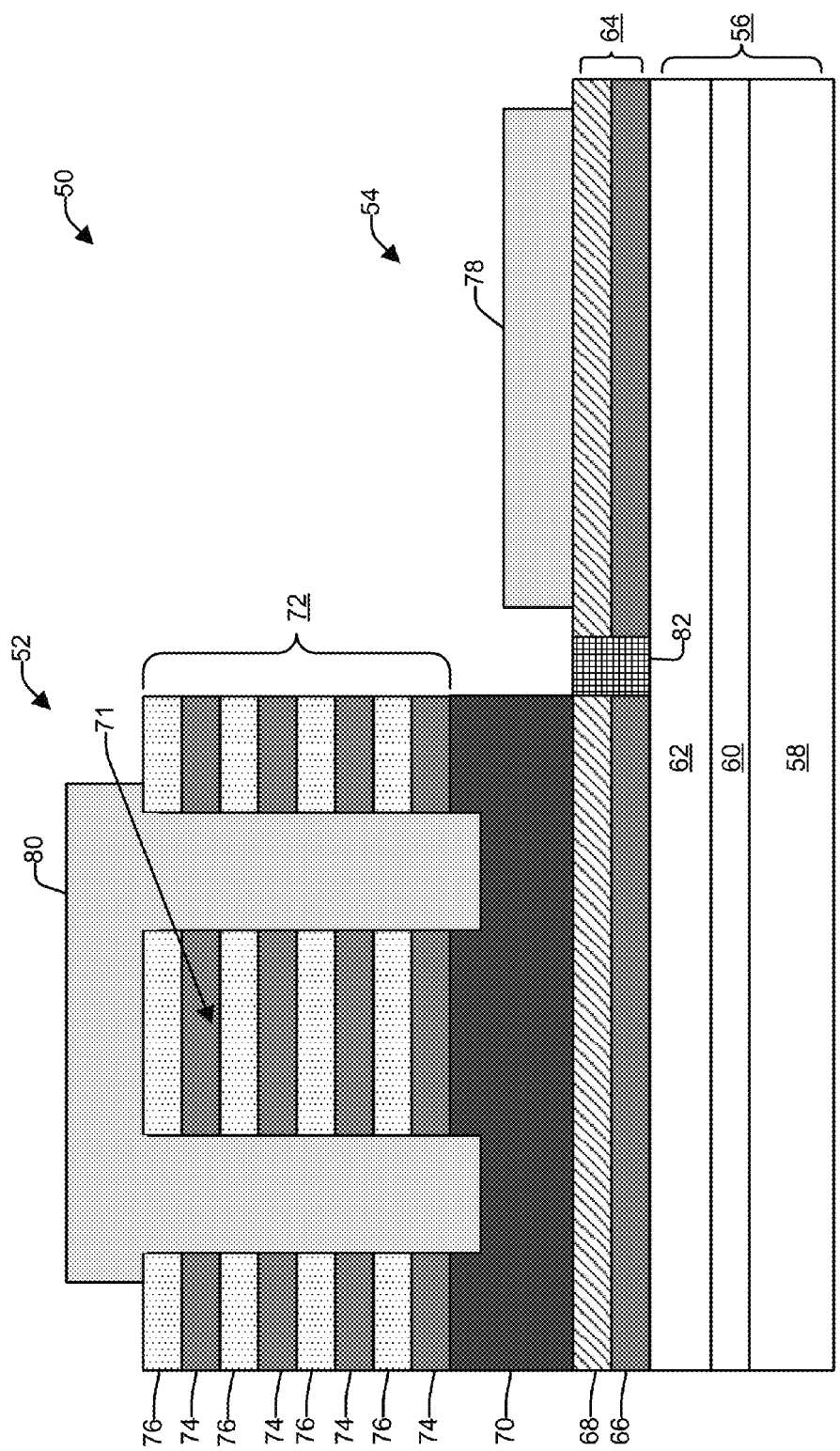
FIG. 3 illustrates yet another example of an integrated multichannel and single channel device structure.

FIG. 3 illustrates another example of an integrated multichannel and single channel device structure 50. The device structure 50 includes a multichannel device 52 adjacent to and isolated from a single channel device 54 by an isolation region 82. The single channel device 54 includes a single shared heterostructure 64 of an undoped AlGaN layer 68 overlying a GaN layer 66. The multichannel device 52 also includes the same single shared heterostructure structure 64 separated by the isolation region 82 and a superlattice structure 72 formed from plurality of heterostructures of doped AlGaN layers 76 overlying GaN layers 74, and separated from the single heterostructure 64 by a relatively thick spacer layer 70 utilized in processing of the integrated multichannel and single channel device structure 50. The spacer layer 70 can be a relatively thick layer of GaN having a thickness of about 200 nm to about 1000 nm (e.g., about 500 nm), and function as a protective layer for the single shared heterostructure 64 portion of the single channel device 54 during subsequent processing. The utilization of a thicker spacer layer 70 allows for larger tolerances during subsequent etch processing.

The single shared heterostructure structure 64 portion of the multichannel device 52 is non-operational since the AlGaN layer 68 is undoped and includes an overlying spacer layer 70 that results in suppression of carriers that would otherwise induce in the potential wells of the single shared heterostructure 64. The four channels (e.g., channels 1-4) formed by the superlattice structure 72 are the operational portion of the multichannel device. By implementing a spacer layer 70 between the standard single channel and multichannel epitaxial stacks, the 2DEG concentration in the undoped single shared heterostructure 64 can be effectively diminished in the multichannel device. This is due to the fact that the spacer layer balances the strain induced in the AlGaN barrier layer, thereby minimizing the piezoelectric polarization. However, removal of the spacer layer above the single channel device during processing allows for re-activation of the heterostructure for utilization of the single channel device 54.

Above a thickness of approximately 50 nm, the spacer layer 70 drastically reduces the electron concentration in the lower channel, while leaving the upper superlattice structure 72 unaffected. This minimization of carrier concentration at a prescribed spacer thickness forces the bottommost channel to be electrically inactive when situated below the spacer layer 70 and superlattice structure 72. Therefore, devices such as the multichannel-based low loss RF switches described herein will operate as if the bottom channel does not exist in the MEGaFET structure 50. A feature of this disclosure is the ability to activate the undoped bottom channel in locations where it is desired to have a single channel heterostructure. This is accomplished by removing the upper superlattice structure 72 and a substantial portion of the spacer layer 70 in the single channel device area. Once these layers are removed the lattice strain is no longer balanced at the AlGaN/GaN interface, and charge carriers are generated due to the polarization effect.

The multichannel device 52 includes a castellated gate contact 80 that surrounds three sides of one or more multi-channel ridges defined by trenches or castellated openings formed in a multichannel castellated channel region of the multichannel device 52 as similarly discussed with respect to FIG. 1. The single channel device 54 includes a planar gate contact 78. The gate contacts 78 and 80 can be made of a conventional contact material comprising layers of nickel and gold, as known in the art. Other gate contacts compositions will be apparent to those skilled in the art.

The multichannel device 52 and the single channel device 54 overlay a base structure 56 that includes a substrate layer 58, a nucleation layer 60 and a buffer layer 62 as similarly discussed with respect to FIG. 1. During the deposition, growth or other formation process of each of AlGaN layers 76 of the superlattice structure 72, a delta doping of an n-type dopant such as silicon (Si) is added the AlGaN material by introducing the dopant gas for a brief time interval, allowing the delta-doping for a confined thickness within the AlGaN layers to induce a 2DEG channel within each heterostructure, as previously discussed in FIG. 1. Similarly, a p-type dopant such as magnesium (Mg) would be introduced to induce a 2DHG channel in relevant heterostructures, as applicable. Other n-type and p-type dopants will be apparent to those skilled in the art.

Figure 4:
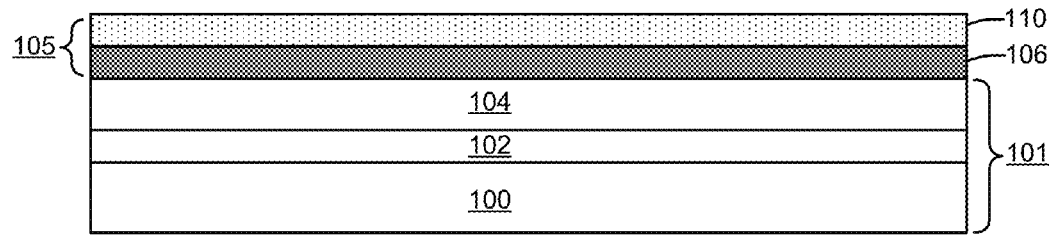
FIG. 4 illustrates a cross-sectional view of an epitaxial structure in its early stages of fabrication.

Turning now to FIGS. 4-14, fabrication is discussed in connection with formation of integrated multichannel and single channel device structure 10 as illustrated in FIG. 1. FIG. 4 illustrates a cross-sectional view of an epitaxial structure in its early stages of fabrication. The epitaxial structure includes a single shared heterojunction structure 105 overlying a base structure 101. As stated above, the base structure 101 can comprise a substrate layer 100, a nucleation layer 102 and a buffer layer 104 formed of a variety of different materials as described above. The single shared heterojunction structure 105 is formed of an AlGaN layer 110 overlying a GaN layer 106. The GaN layer 106 is deposited over the base structure 101 and the AlGaN layer 110 is deposited over the GaN layer 106. Any suitable technique for depositing each layer can be employed such as metal organic chemical vapor deposition (MOVCD), molecular beam epitaxy (MBE) or other suitable deposition techniques.

The AlGaN layer 110 is doped with an n-type dopant to induce carriers and replacing the effect that would have occurred but for the balancing effect of multiple symmetric heterostructures. As stated above, the delta-doping concentration can be between about $1E17$ $cm^{-3}$ and about $1E20$ $cm^{-3}$. Other delta-doping concentrations will be apparent to those skilled in the art. Next, a barrier layer 112 is deposited over the structure illustrated in FIG. 4 to provide the resultant structure shown in FIG. 5. The barrier layer 112 is employed as an etch stop during subsequent processing and may be deposited by any suitable technique for forming the barrier layer, such as MOVCD or MBE. As stated above, the barrier layer 112 can be a relatively thin layer of AlN having a thickness of about 1 nm to about 20 nm (e.g., about 5 nm to about 10 nm) or GaN having a thickness of about 50 nm to about 200 nm (e.g., about 100 nm).

Figure 5:
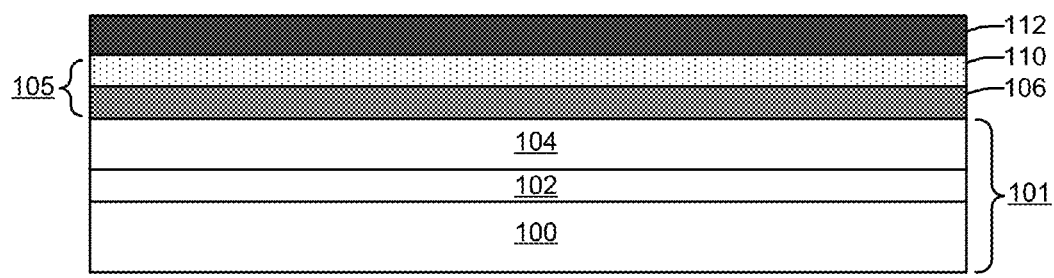
FIG. 5 illustrates a cross-sectional view of the structure of FIG. 5 after an etch stop layer deposition.
Figure 6:
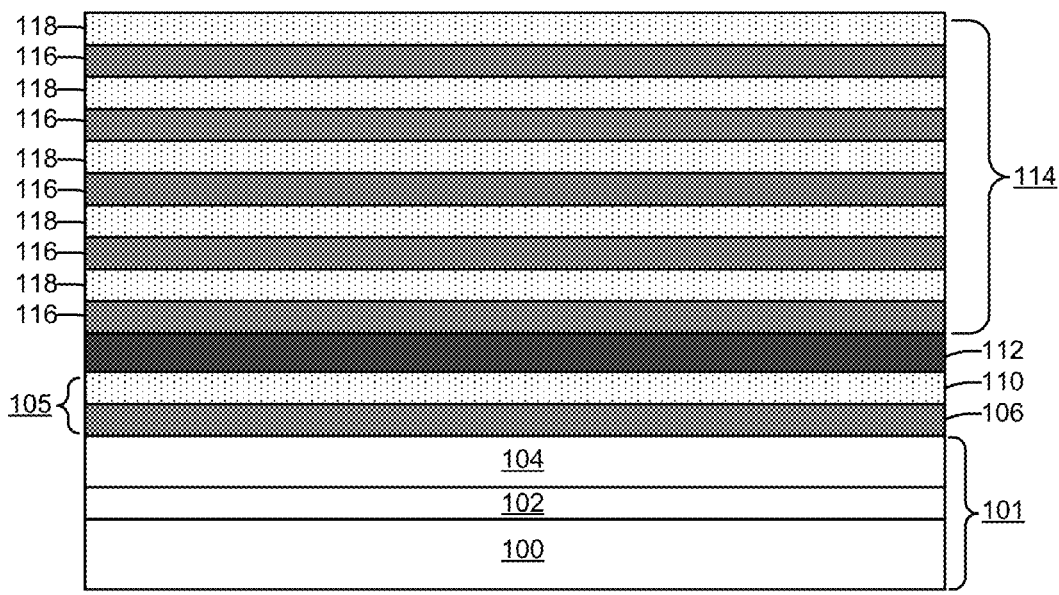
FIG. 6 illustrates a cross-sectional view of the structure of FIG. 6 after formation of a superlattice structure over the etch stop layer.
Figure 7:
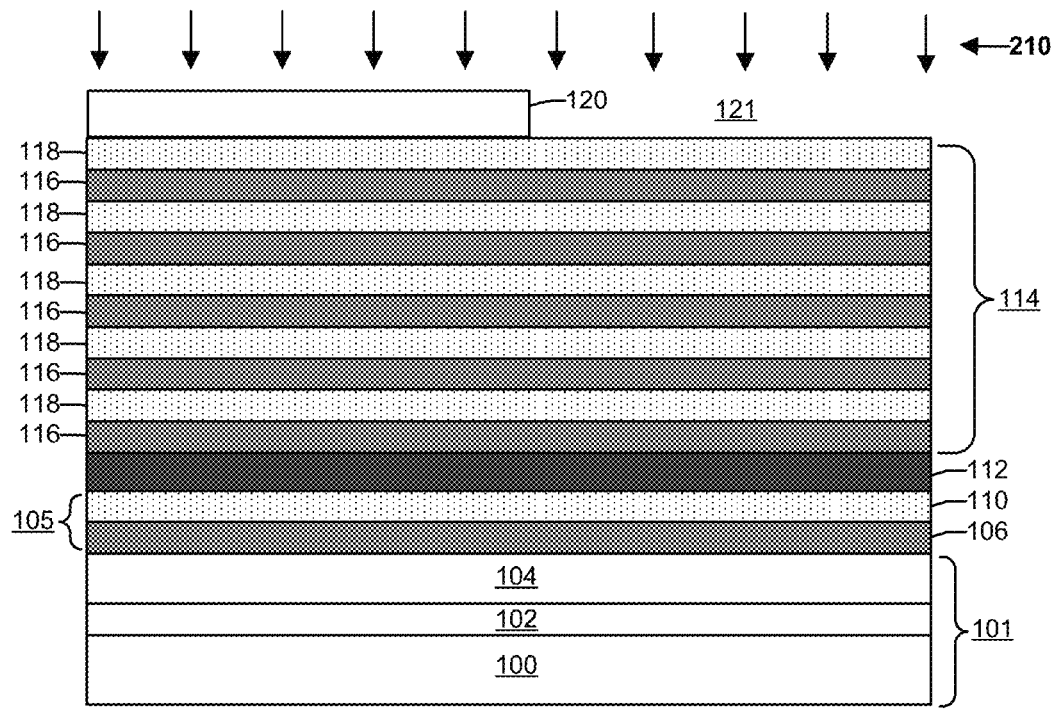
FIG. 7 illustrates a cross-sectional view of the structure of FIG. 6 undergoing a superlattice structure etch.
Figure 8:
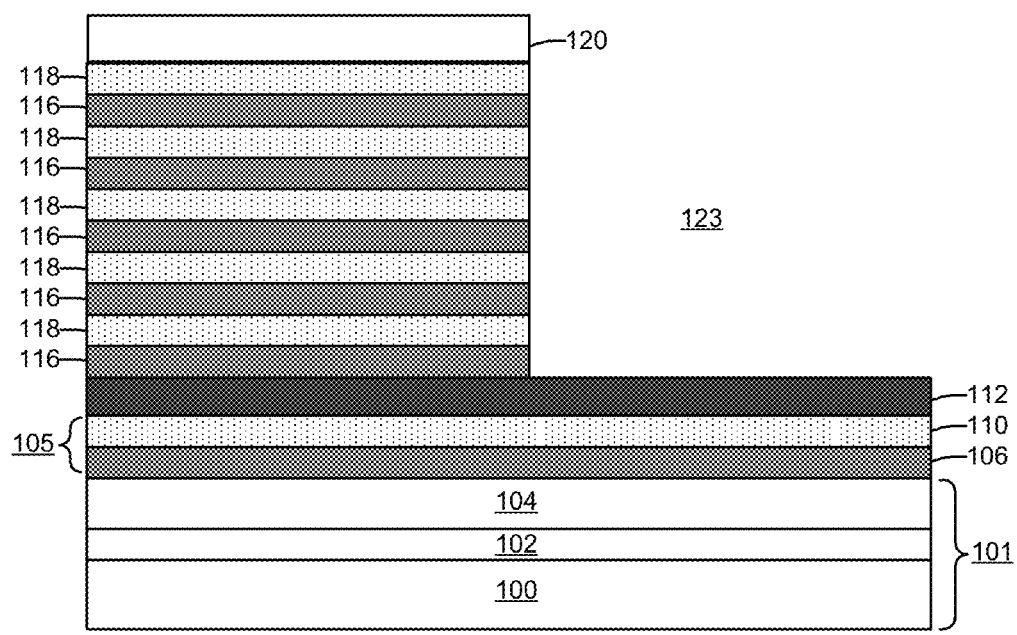
FIG. 8 illustrates a cross-sectional view of the structure of FIG. 7 after undergoing the superlattice structure etch.

FIG. 6 illustrates the structure of FIG. 5 after formation of a superlattice structure 114 overlying the barrier layer 112. The superlattice structure 114 is formed from plurality of heterostructures of AlGaN layers 118 overlying GaN layers 116 utilizing the same or similar deposition techniques employed in forming the single shared heterojunction structure 105 of FIG. 3. Next, as shown in FIG. 7, a photoresist material layer 120 is deposited over the superlattice structure 114 and patterned and developed to provide an opening 121 over a single channel area of the structure where the single channel device is to be formed. The photoresist material layer 120 can have a thickness that varies in correspondence with the wavelength of radiation used to pattern the photoresist material layer 120. The photoresist material layer 120 may be formed over the superlattice structure 114 via spin-coating or spin casting deposition techniques, selectively irradiated and developed to form the opening 121.

FIG. 7 also illustrates performing of an etch 210 (e.g., anisotropic reactive ion etching (RIE)) on the superlattice structure 114 to remove a portion of the superlattice structure under the opening 121 in the photoresist material layer 120 and form extended opening 123. The resultant structure is illustrated FIG. 8. The etch step 210 can be a dry etch that employs an etchant which selectively etches the superlattice structure 114 at a faster rate than the underlying barrier layer 112 and the overlying photoresist material layer 120. For example, the supperlattice 114 structure may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 120 to thereby remove portion of the superlattice structure and leave only the single shared heterostructure 105 in the single channel area for formation of the single channel device.

Figure 9:
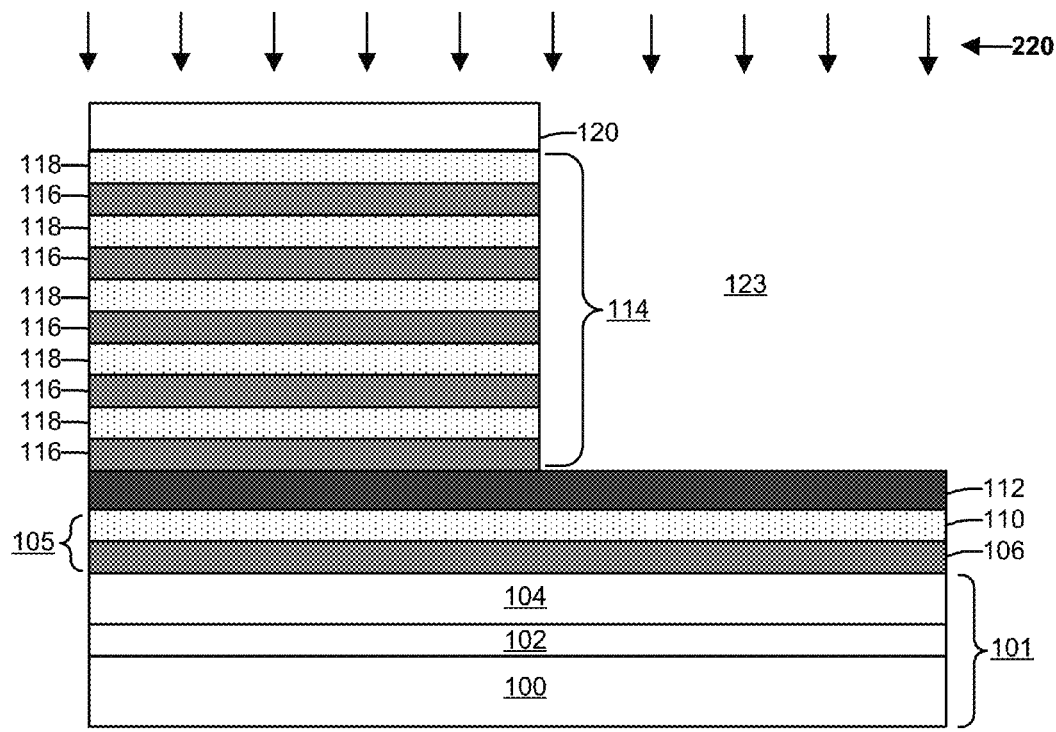
FIG. 9 illustrates a cross-sectional view of the structure of FIG. 8 undergoing a barrier layer etch.
Figure 10:
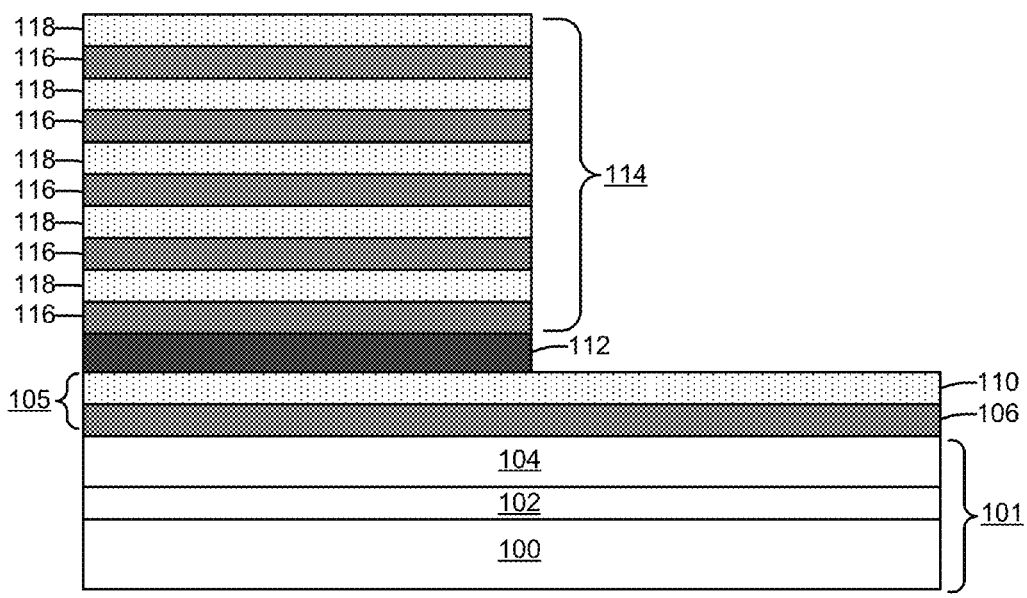
FIG. 10 illustrates a cross-sectional view of the structure of FIG. 9 after the barrier layer etch.

FIG. 9 illustrates performing of another etch 220 (e.g., anisotropic reactive ion etching (RIE)) on the barrier layer to remove portion of the barrier layer 112 under the extended opening 123. The etch step 220 can be a dry etch that employs an etchant which selectively etches the barrier layer 112 at a faster rate than the underlying AlGaN layer 110 and the overlying photoresist material layer 120. The photoresist material layer 120 is then stripped to provide the resultant structure of FIG. 10 with the surface of the AlGaN layer 110 exposed to the ambient environment.

Figure 11:
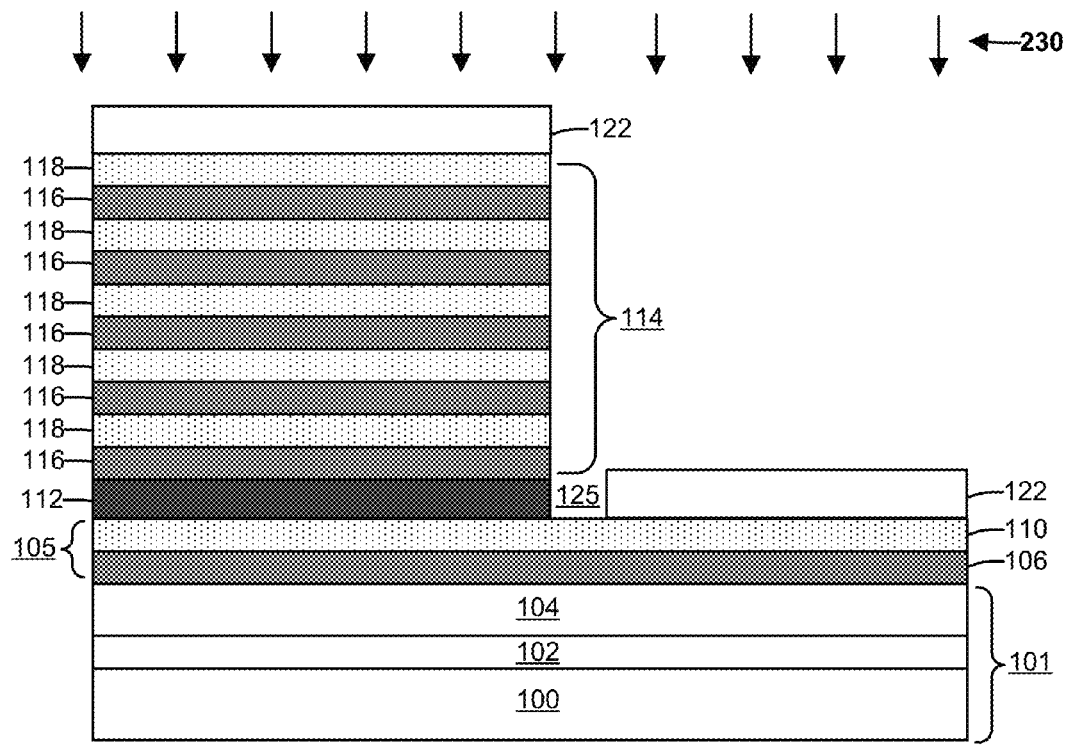
FIG. 11 illustrates a cross-sectional view of the structure of FIG. 10 undergoing an ion implantation to form an isolation region.
Figure 12:
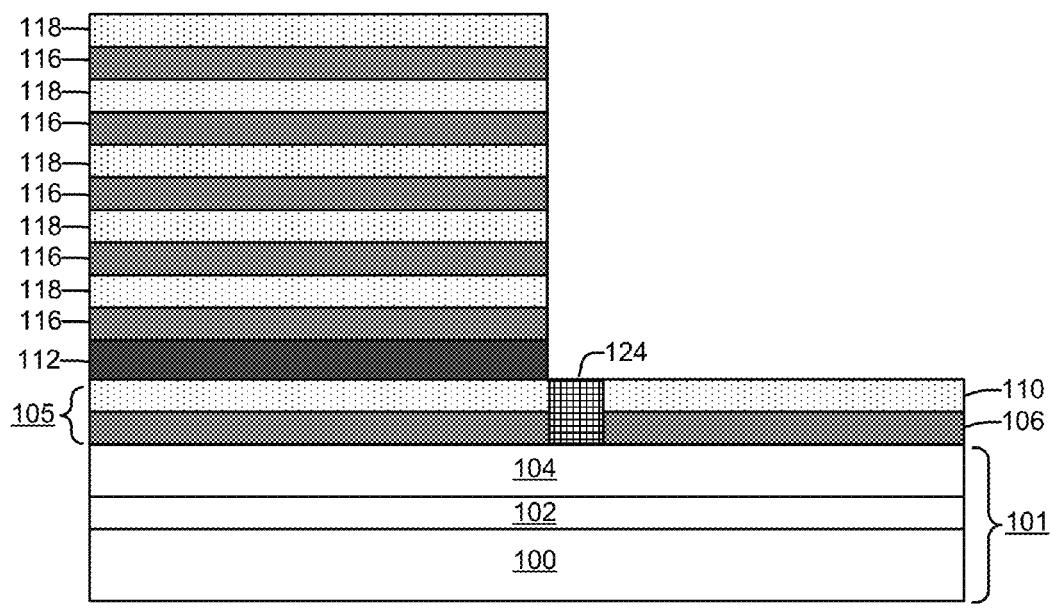
FIG. 12 illustrates a cross-sectional view of the structure of FIG. 11 after undergoing the ion implantation to form the isolation region.

Now referring to FIG. 11, a photoresist material layer 122 is deposited over the portions of the structure of FIG. 11 and patterned and developed to provide an opening 125 over an isolation area to form an isolation region 124 (FIG. 12) to isolate the portion of the single shared heterostructure 105 that forms parts of the single channel device from portions of the shared heterostructure 105 that forms part of the multichannel device. The isolation region 124 is formed by an ion implantation 230, for example, whereby helium atoms can be accelerated at a high velocity into the heterostructure 105 to disrupt its crystalline geometry, thereby eliminating the 2DEG channel effectivity within the isolated region 124 and rendering non-operable those 2DEG channels contained in the isolation regions. Alternatively, a mesa etch can be performed to achieve the same result. This same procedure can be performed on other portions of the structure to isolate the multichannel device and single channel device from other devices on the integrated circuit or wafer. The photoresist material layer 122 is then stripped to provide the resultant structure of FIG. 12.

Figure 13:
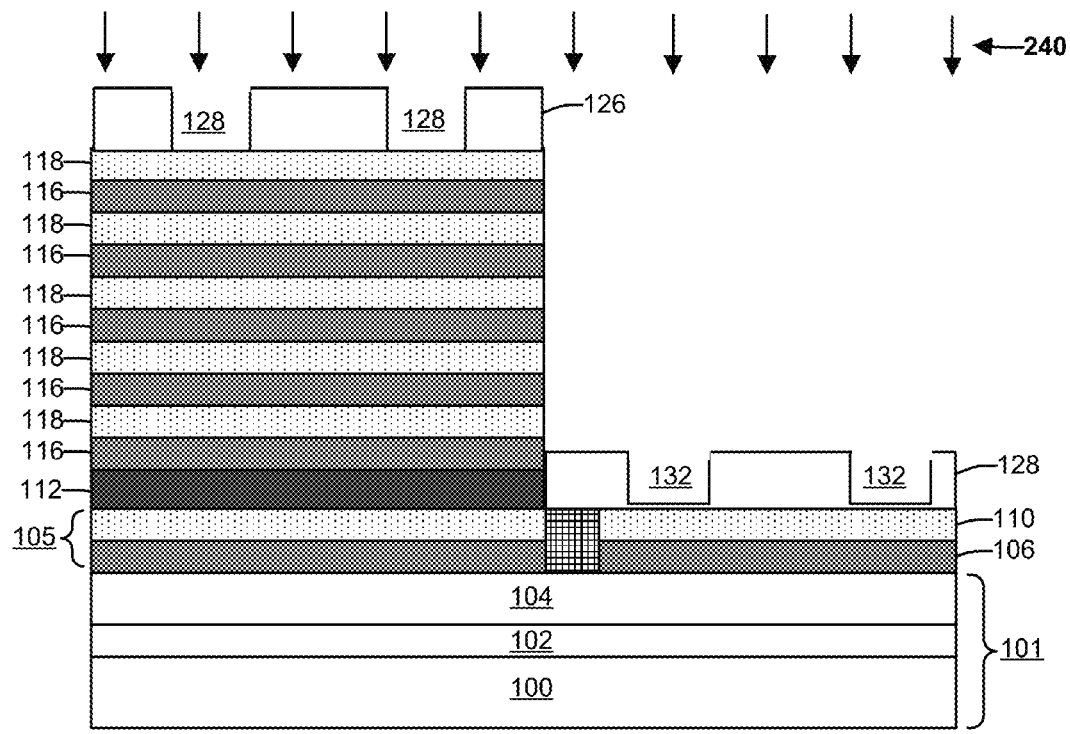
FIG. 13 illustrates a cross-sectional view of the structure of FIG. 12 undergoing a gate castellation etch.
Figure 14:
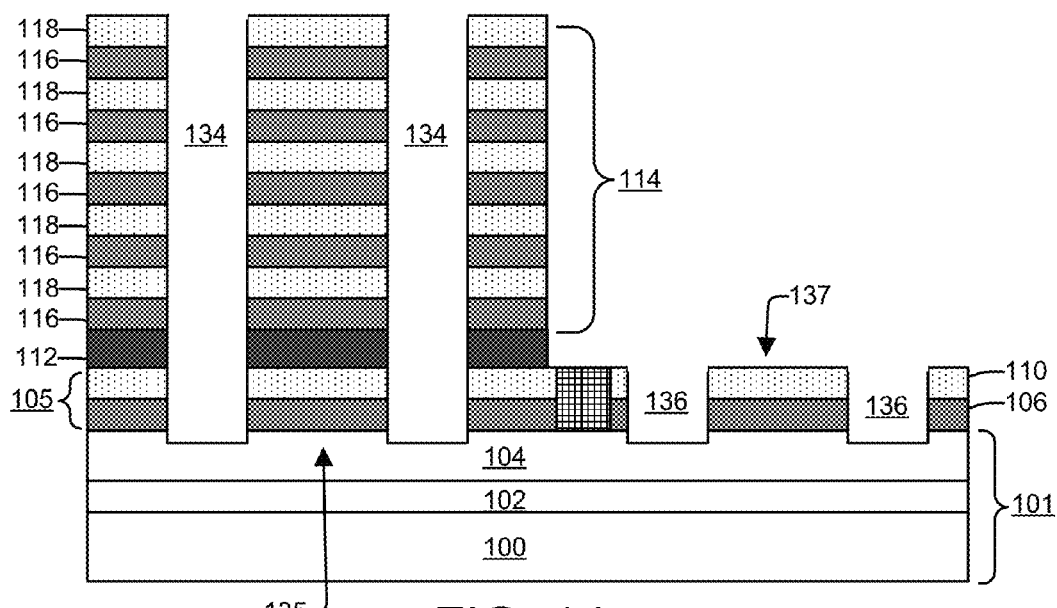
FIG. 14 illustrates a cross-sectional view of the structure of FIG. 13 after undergoing a gate castellation etch.

Next, a photoresist material layer 126 is deposited over the entire structure and patterned and developed to form contact fill openings 128 and 132 for forming castellated gate contacts, as illustrated in FIG. 13. FIG. 13 also illustrates performing of an etch 240 (e.g., anisotropic reactive ion etching (RIE)) on the shared heterostructure 105 and the superlattice structure 114 to form trenches or castellated openings 134 and 136 (FIG. 14) based on the pattern in the photoresist material layer 126. The etch step 240 can be a dry etch that employs an etchant which selectively etches the superlattice structure 114 and the shared heterostructure layer 105 at a faster rate than the underlying layers and the overlying photoresist material layer 126. Although only one etch is shown, it is to be appreciated that two different etches could be performed, such that a first etch could be performed to form trenches or castellated openings in the superlattice structure 114 and a second etch could be performed to extend and form the trenches or castellated openings in the single shared heterostructure 105. The photoresist material layer 126 is then stripped to provide the resultant structure of FIG. 14 with trenches or castellated openings 134 that define one or more multichannel ridges 135 formed in a multichannel castellated channel region, and with trenches or castellated openings 136 that define one or more single channel ridges 137 formed in a single channel castellated channel region both extending partially into the base structure 101.

A gate contact fill (not shown) is performed to fill the trenches with a conductive material to form castellated gate contacts (e.g., schottky contacts) that surround three sides of the one or more multichannel ridges 135 and the one or more single channel ridges 137, as illustrated in FIG. 1. The gate contacts can be made of a conventional contact material comprising layers of nickel and gold, as known in the art. Other gate contacts compositions will be apparent to those skilled in the art. Typically drain and source contacts will have been formed prior to the gate castellation etch and contact formation, but they may also be formed subsequently or concurrently. An overlying passivation layer can be deposited over the final structure to complete formation of the final integrated single channel device and multichannel device.

Turning now to FIGS. 15-22, fabrication is discussed in connection with formation of integrated multichannel and single channel device structure 50 as illustrated in FIG. 3. A barrier layer in the form of a spacer layer 140 is deposited over the structure illustrated in FIG. 4 to provide the resultant structure shown in FIG. 15. However, the AlGaN layer of FIG. 4 is replaced with an undoped AlGaN layer 1080. The spacer layer 140 is employed as a protective layer during subsequent processing and may be deposited by any suitable technique for forming the spacer layer, such as MOVCD or MBE. The spacer layer 140 can be a relatively thick layer of GaN having a thickness of about 200 nm to about 1000 nm (e.g., about 500 nm), and function as a protective layer for the single shared heterostructure 64 portion of the single channel device 54 during subsequent processing.

Figure 15:
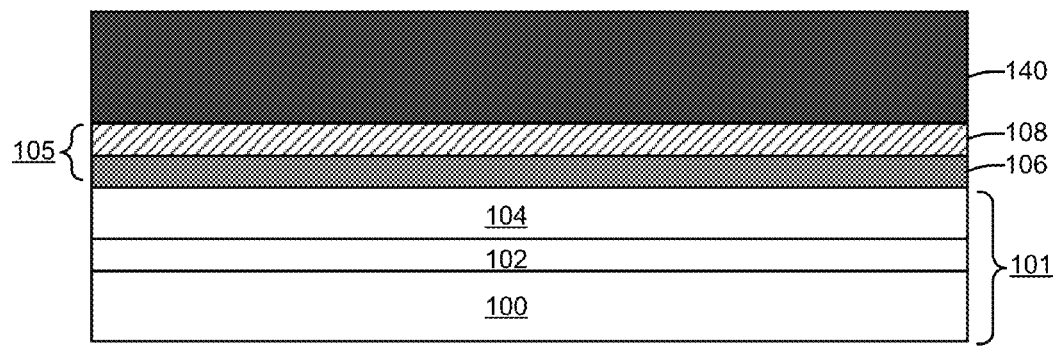
FIG. 15 illustrates a cross-sectional view of the structure of FIG. 4 after spacer layer deposition.
Figure 16:
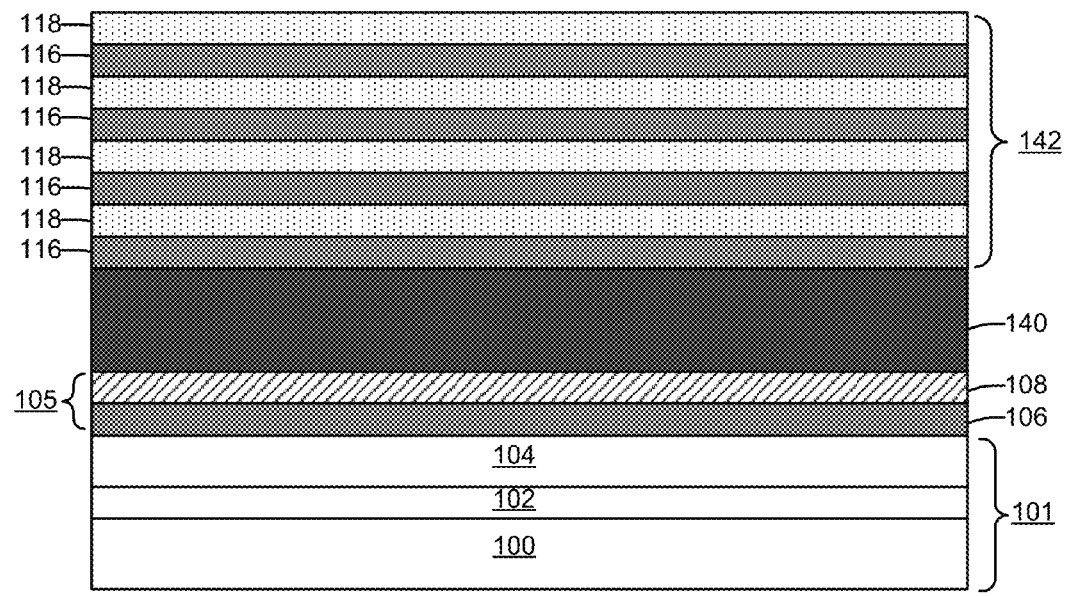
FIG. 16 illustrates a cross-sectional view of the structure of FIG. 15 after formation of a superlattice structure over the spacer layer.
Figure 17:
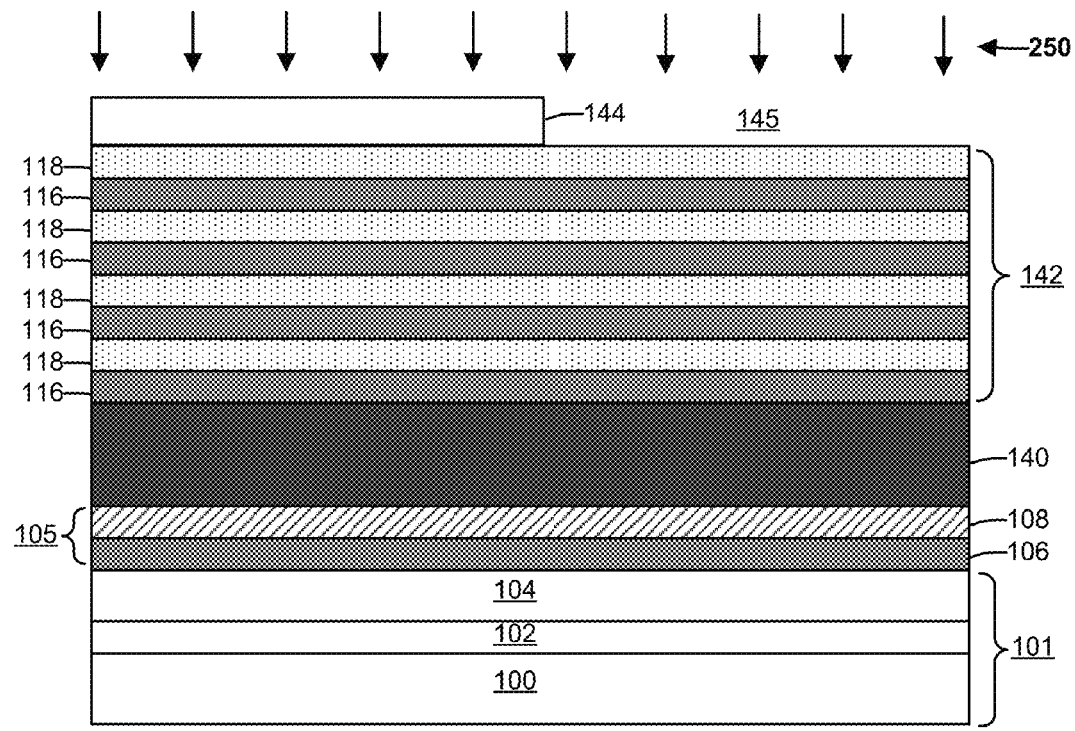
FIG. 17 illustrates a cross-sectional view of the structure of FIG. 16 undergoing a superlattice structure etch.
Figure 18:
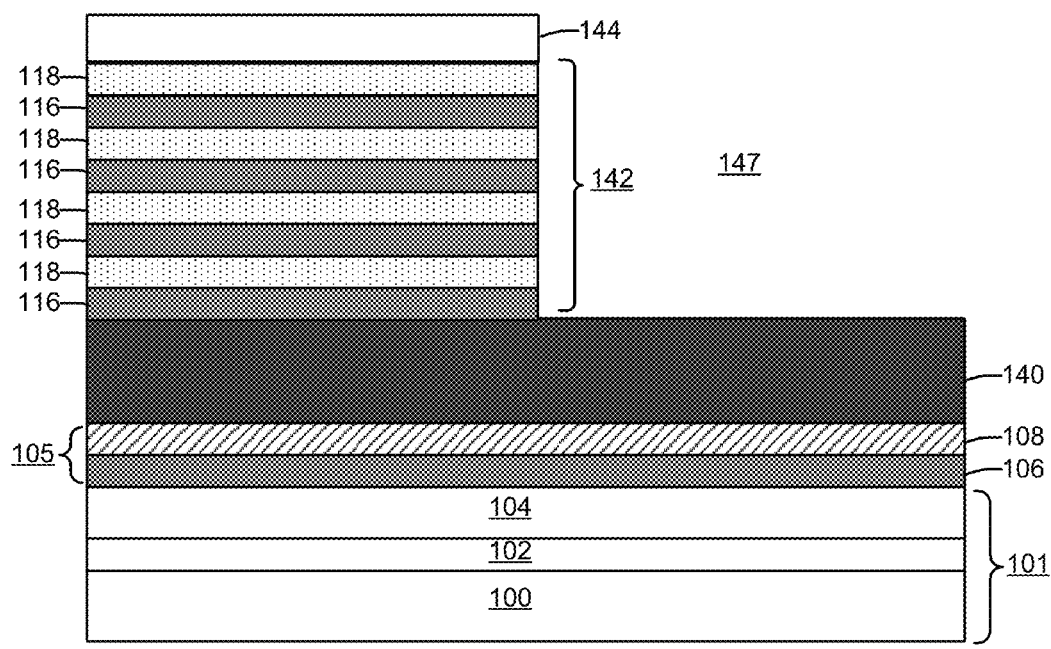
FIG. 18 illustrates a cross-sectional view of the structure of FIG. 17 after undergoing the superlattice structure etch.

FIG. 16 illustrates the structure of FIG. 15 after formation of a superlattice structure 142 overlying the spacer layer 140. Next as illustrated in FIG. 17, a photoresist material layer 144 is deposited over the superlattice structure 142 and patterned and developed to provide an opening 145 over a single channel device area of the structure where the single channel device is to be formed. The photoresist material layer 144 can have a thickness that varies in correspondence with the wavelength of radiation used to pattern the photoresist material layer 144. The photoresist material layer 144 may be formed over the superlattice structure 142 via spin-coating or spin casting deposition techniques, selectively irradiated and developed to form the opening 145.

FIG. 17 also illustrates performing of an etch 250 (e.g., anisotropic reactive ion etching (RIE)) on the superlattice structure 142 to remove portion of the superlattice structure 142 under the opening 145 in the photoresist material layer 120 and form extended opening 147. The resultant structure is illustrated FIG. 18. The etch step 250 can be a dry etch that employs an etchant which selectively etches the supperlatice structure 142 at a faster rate than the underlying spacer layer 140 and the overlying photoresist material layer 144. For example, the supperlattice structure 142 may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 144 to thereby remove portion of the superlattice structure 142 and leave only the single shared heterostructure 105 in the single channel area for formation of the single channel device.

The spacer layer 140 acts as a protective barrier layer during the etch 250 to protect the underlying AlGaN layer 108 from damage by the etch 250. Due to the relatively large thickness of the spacer layer 140, an aggressive etch (e.g., a wet etch) can be employed that can be timed, or monitored utilizing spectroscopy. Additionally, a second higher tolerance etch can be employed after a predetermined time or predetermined thickness of the spacer layer that has a higher selectivity to the spacer layer 140 over the underlying AlGaN layer 108.

Figure 19:
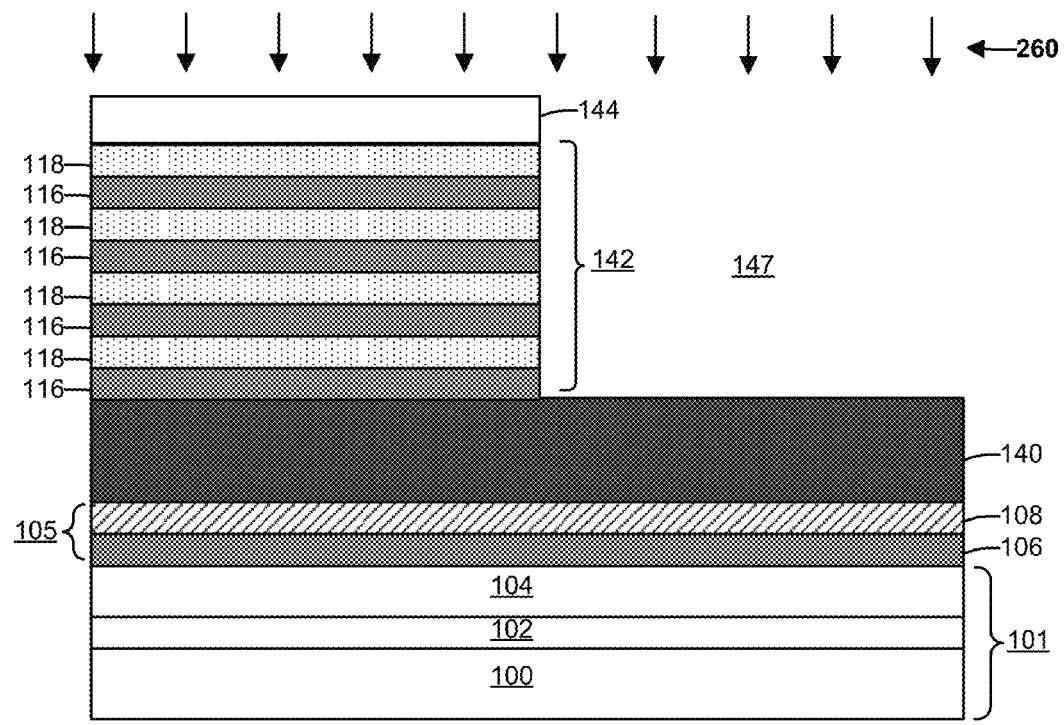
FIG. 19 illustrates a cross-sectional view of the structure of FIG. 18 undergoing a spacer layer etch.
Figure 20:
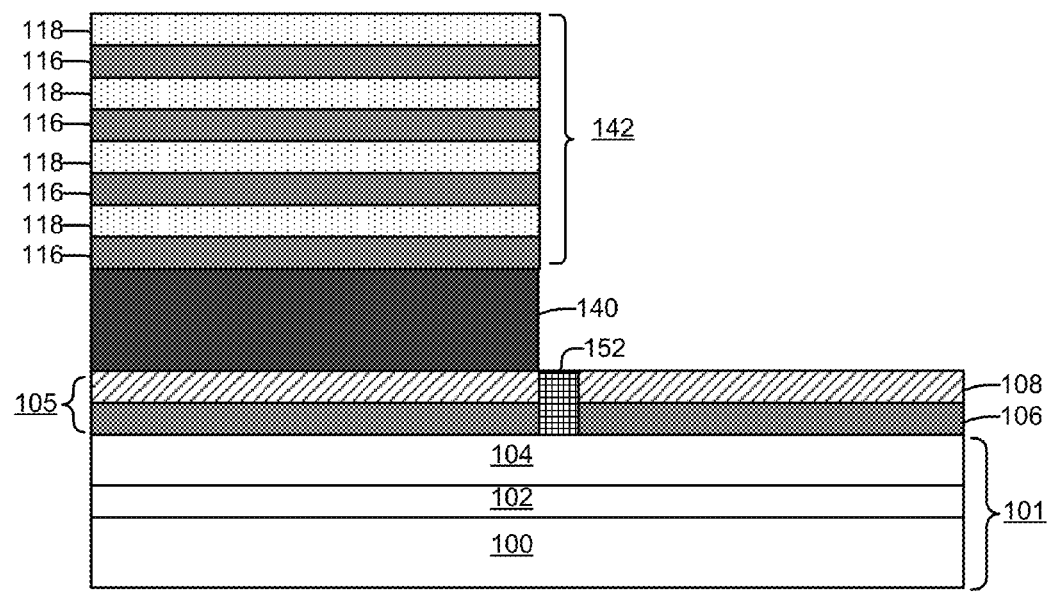
FIG. 20 illustrates a cross-sectional view of the structure of FIG. 19 after undergoing the spacer layer etch.

FIG. 19 illustrates performing of another etch 260 (e.g., anisotropic reactive ion etching (RIE)) on the spacer layer 140 to remove portion of the spacer layer 140 under the extended opening 147. The etch 260 can be a dry etch that employs an etchant which selectively etches the spacer layer 140 at a faster rate than the underlying AlGaN layer 108 and the overlying photoresist material layer 144. The photoresist material layer 144 is then stripped to provide the resultant structure of FIG. 20 with the surface of the AlGaN layer 108 exposed to the ambient environment. An isolation region 152 can be formed to separate the multichannel device from the single channel device by employing the same techniques discussed with respect to FIGS. 11-12.

Figure 21:
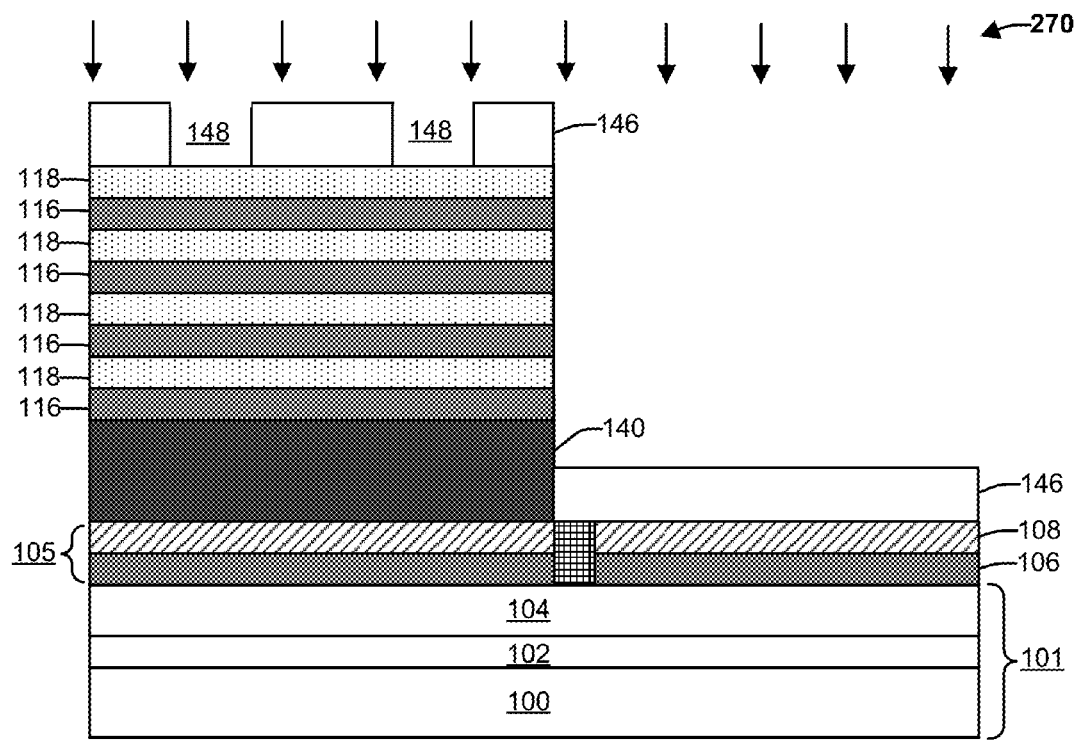
FIG. 21 illustrates a cross-sectional view of the structure of FIG. 21 undergoing a gate castellation etch.
Figure 22:
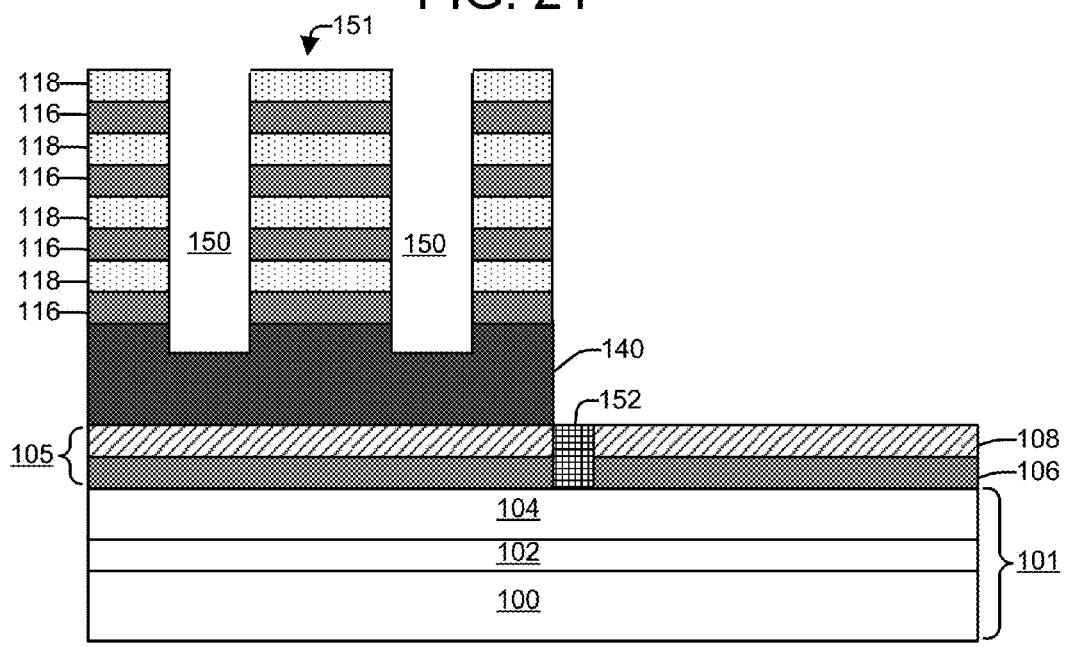
FIG. 22 illustrates a cross-sectional view of the structure of FIG. 22 after undergoing a trench opening etch.

Next, a photoresist material layer 146 is deposited over the entire structure and patterned and developed to form contact fill openings 148 for forming a castellated gate contact for the multichannel device, as illustrated in FIG. 21. FIG. 21 also illustrates performing of an etch 270 (e.g., anisotropic reactive ion etching (RIE)) on the shared heterostructure 105 and the superlattice structure 142 to form trenches or castellated openings 150 (FIG. 22) based on the pattern in the photoresist material layer 146. The etch 240 can be a dry etch that employs an etchant which selectively etches the superlattice structure 142 a faster rate than the underlying layers and the overlying photoresist material layer 146. The photoresist material layer 146 is then stripped to provide the resultant structure of FIG. 22 with trenches or castellated openings 150 extending partially into the spacer layer 140 that define one or more multichannel ridges 151 of the multichannel device.

A gate contact fill is performed (not shown) to fill the trenches with a conductive material to form castellated gate contacts that surround three sides of the multichannel ridges and a planar gate for the single channel device as illustrated in FIG. 2. The gate contacts can be made of a conventional contact material comprising layers of nickel and gold, as known in the art. Other gate contacts compositions will be apparent to those skilled in the art. Subsequently or concurrently drain and source contacts can be formed and an overlying passivation layer deposited over the final structure to form the final integrated single channel device and multichannel device.

Figure 23:
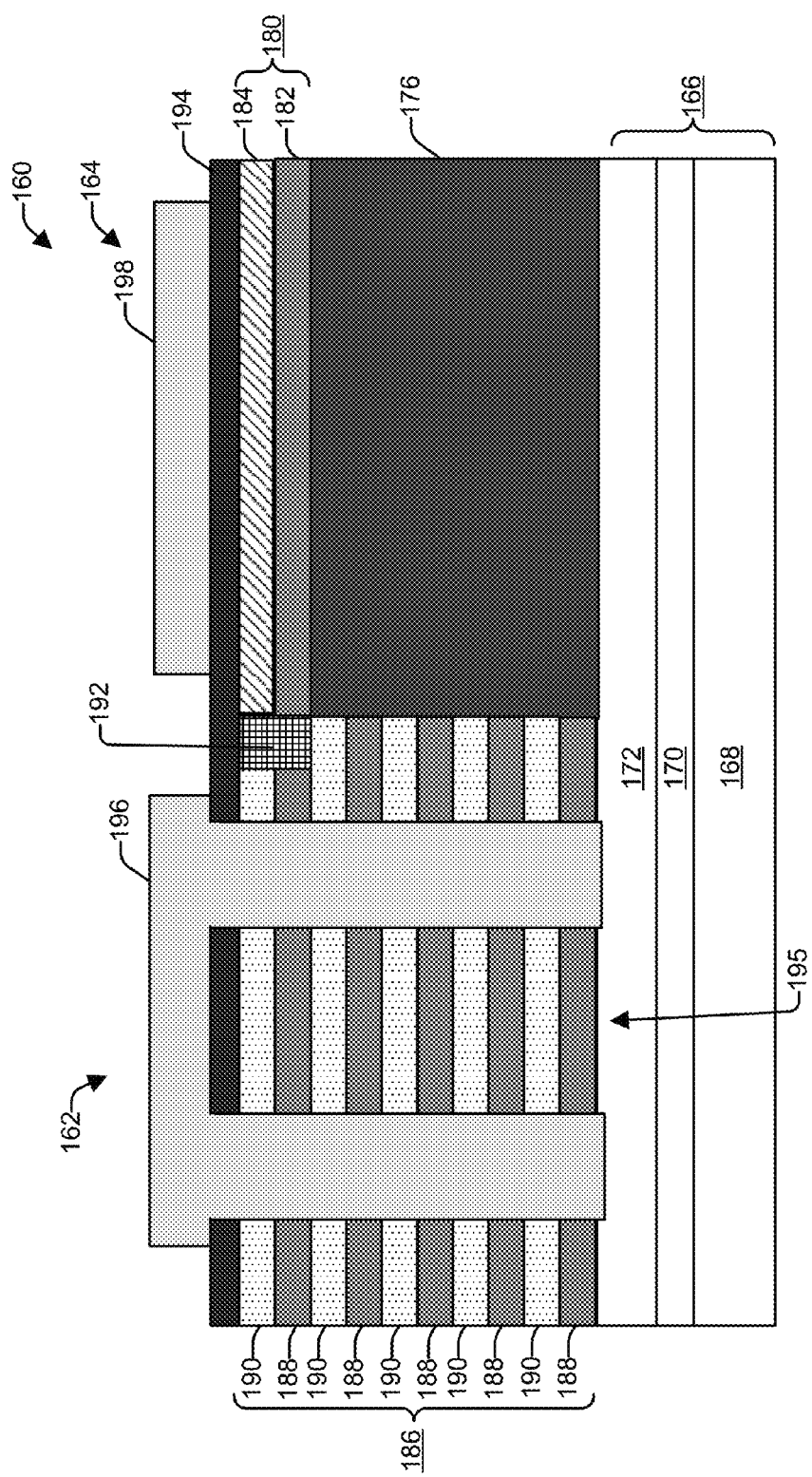
FIG. 23 illustrates yet another example of an integrated multichannel and single channel device structure.

FIG. 23 illustrates yet another example of an integrated multichannel and single channel device structure 160. The device structure 160 includes a multichannel device 162 adjacent and isolated from a single channel device 164 by an isolation region 192. The single channel device 164 includes a single heterostructure 180 of an undoped AlGaN layer 184 overlying a GaN layer 182. The single heterostructure 180 overlies a thick spacer layer 176 that overlies a base structure 166. The base structure 166 can comprise a substrate layer 168, a nucleation layer 170 and a buffer layer 172 formed of a variety of different materials as previously described. The multichannel device 162 includes a superlattice structure 186 formed from a plurality of heterostructures of alternating doped AlGaN layers 190 overlying GaN layers 188. The superlattice structure 186 also overlies the base structure 166. A capping layer 194 (e.g., silicon nitride) overlies the superlattice structure 186 and the single heterostructure 180.

The multichannel device 162 includes a castellated gate contact 196 that surrounds three sides of one or more multichannel ridges in a multichannel area of the multichannel device 162, as also discussed with respect to FIG. 1. The single channel device 164 includes a planar gate contact 198. The gate contacts can be made of a conventional contact material comprising layers of nickel and gold, as known in the art. Other gate contacts compositions will be apparent to those skilled in the art.

Figure 24:
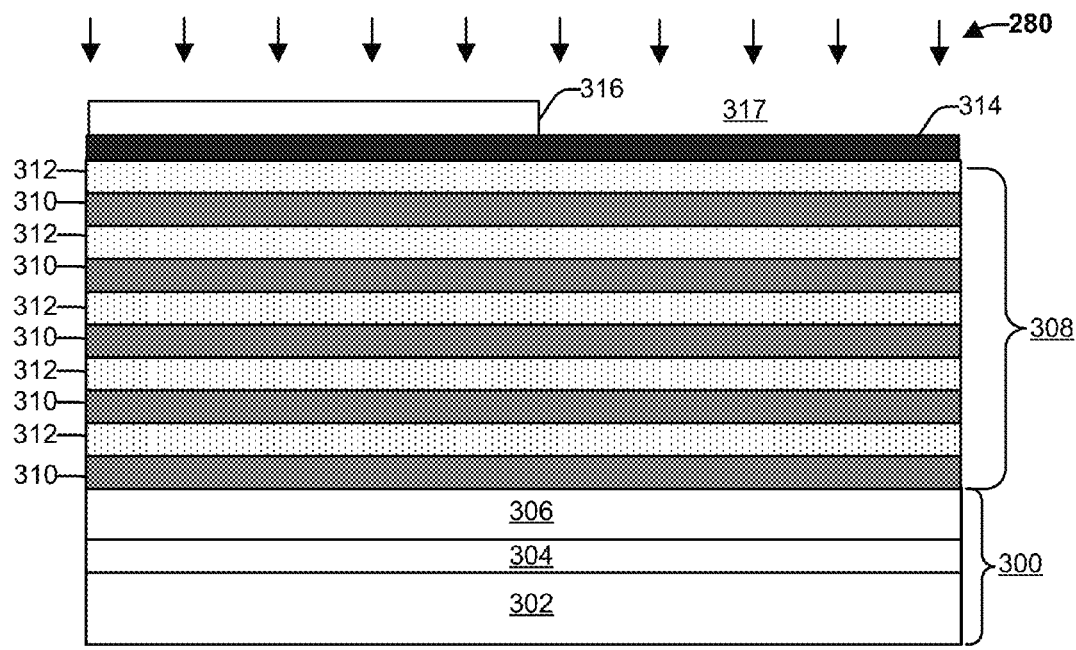
FIG. 24 illustrates a cross-sectional view of a structure after formation of a superlattice structure over a base structure, and a capping layer over the superlattice structure.

Turning now to FIGS. 24-27, fabrication is discussed in connection with formation of integrated multichannel and single channel device structure 160 as illustrated in FIG. 23. FIG. 24 illustrates a cross-sectional view of a structure after formation of a superlattice structure 308 overlying a base structure 300, and a capping layer 314 overlying the superlattice structure 308. The base structure 300 can comprise a substrate layer 302, a nucleation layer 304 and a buffer layer 306 formed of a variety of different materials as previously described. The superlattice structure 308 is formed from plurality of heterostructures of AlGaN layers 312 overlying GaN layers 310 utilizing the same or similar deposition techniques employed in forming the single shared heterojunction structure 105 of FIG. 4.

Next, a photoresist material layer 316 is deposited over the capping layer 314 and patterned and developed to provide an opening 317 over a single channel device area of the structure where the single channel device is to be formed. The photoresist material layer 316 can have a thickness that varies in correspondence with the wavelength of radiation used to pattern the photoresist material layer 316. The photoresist material layer 316 may be formed over the capping layer 314 via spin-coating or spin casting deposition techniques, selectively irradiated and developed to form the opening 317.

Figure 25:
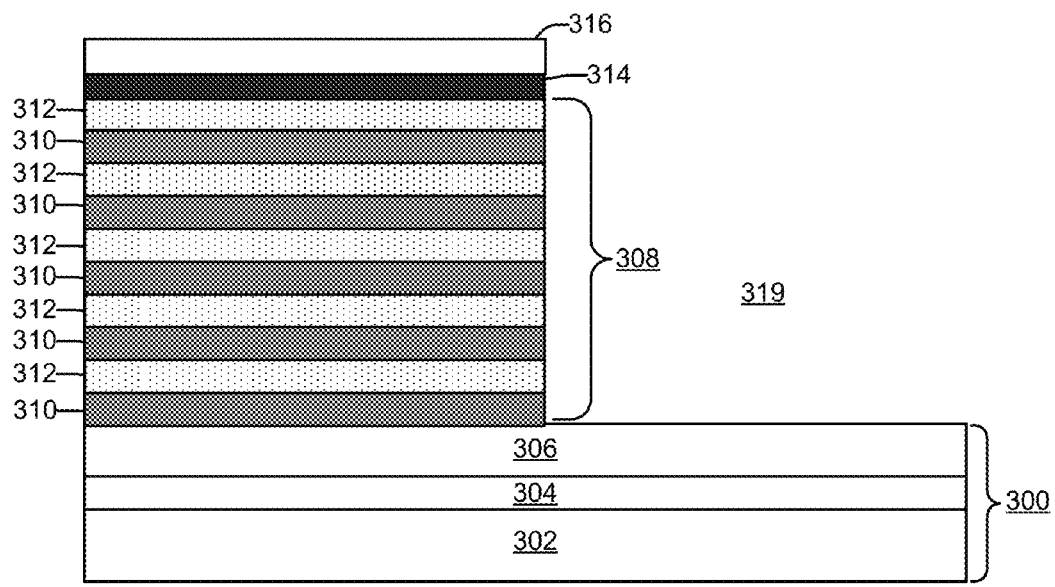
FIG. 25 illustrated the structure of FIG. 24 after undergoing an etch.

FIG. 24 also illustrates performing of an etch 280 (e.g., anisotropic reactive ion etching (RIE)) on the capping layer 314 and the superlattice structure 308 to remove portion of the capping layer 314 and the superlattice structure 308 under the opening 317 in the photoresist material layer 316 and form extended opening 319, as illustrated in the resultant structure of FIG. 25. The etch step 280 can be a dry etch that may be an anisotropic etched with plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 316 to thereby remove portions of the capping layer 314 and the superlattice structure 308.

Figure 26:
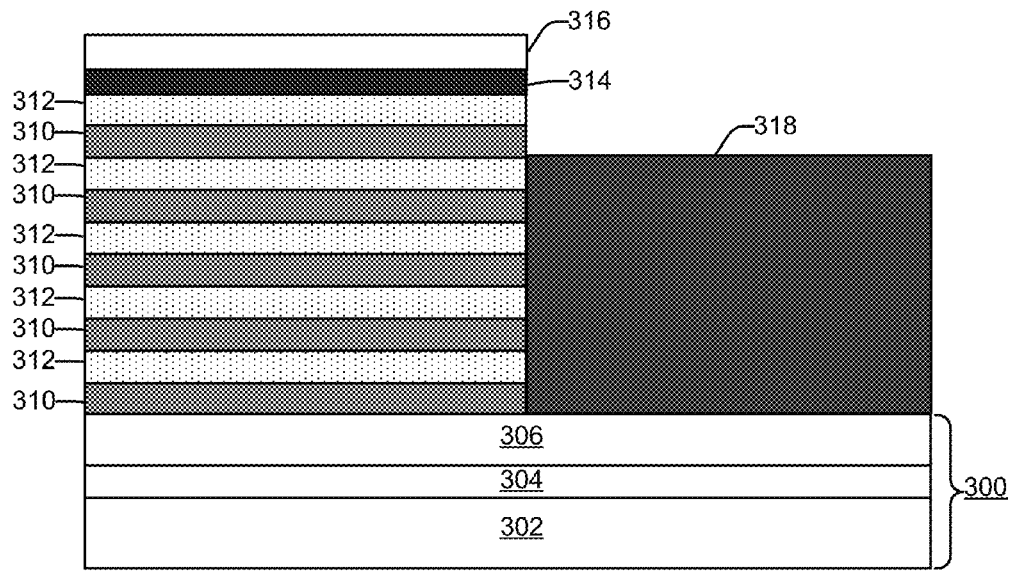
FIG. 26 illustrates the structure of FIG. 24 after deposition of a spacer layer over the base structure on the single channel device side.
Figure 27:
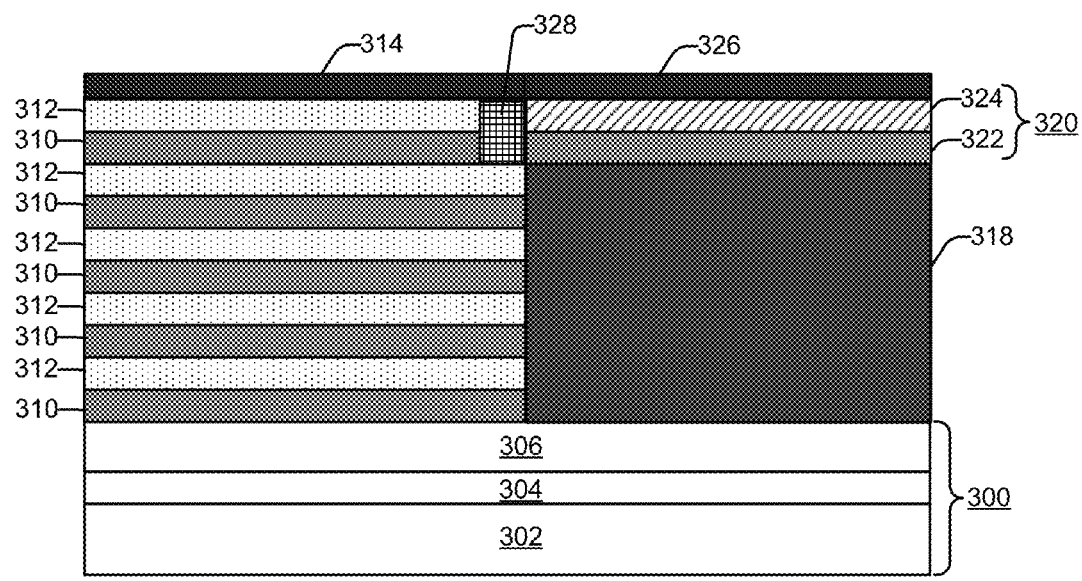
FIG. 27 illustrates the structure of FIG. 26 after formation of a single heterostructure over the spacer layer, and a second capping layer over the single heterostructure.

FIG. 26 illustrates the structure after deposition of a spacer layer 318 over the base structure 300 on the single channel device side. Next, a single heterostructure 320 is formed over the spacer layer 318, and a second capping layer 326 is formed over the single heterostructure 320. The single heterostructure 320 is formed of an undoped AlGaN layer 324 overlying a GaN layer 322. An isolation region 328 can be formed as previously discussed to isolate the multichannel device from the single channel device. The photoresist material layer 316 is then stripped to provide the resultant structure of FIG. 27. A gate contact formation process can then be performed as previously discussed to form a castellated gate for the multichannel device and a planar get for the single channel device to provide a resultant structure similar to the resultant structure illustrated in FIG. 23.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An integrated circuit comprising:
a single channel device comprising a first portion of a single shared heterostructure overlying a substrate structure in a single channel device area, and a gate contact that is in contact with the first portion of the single shared heterostructure;
a multichannel device comprising a second portion of the single shared heterostructure overlying the substrate structure in a multichannel device area, the multichannel device further comprising a superlattice structure overlying the single shared heterostructure, the superlattice structure comprising a plurality of heterostructures, wherein trenches are formed in portions of the multichannel structure to create castellated gate contacts;
an isolation region in the single shared heterostructure that electrically isolates the single channel device from the multichannel device; and
source and drain contact regions formed on opposite sides of the gate contacts in each of the single channel device and the multichannel device regions to create transistors in each region.

2. The circuit of claim 1, wherein the single shared heterostructure is doped and forms one of the channels of the multichannel device.

3. The circuit of claim 2, wherein each of the plurality of heterostructures of the superlattice structure are doped and form additional channels in the multichannel device.

4. The circuit of claim 1, wherein the single shared heterostructure is undoped and inoperable and does not form one of the channels of the multichannel device and each of the plurality of heterostructures of the superlattice structure are doped and form each of the channels of the multichannel device.

5. The circuit of claim 1, wherein a barrier layer is overlying a nucleation layer that is overlying the substrate structure.

6. The circuit of claim 5, wherein the superlattice structure is overlying the barrier layer.

7. The circuit of claim 6, wherein the trenches extend through the shared heterostructure and into the barrier layer.

8. The circuit of claim 6, wherein the barrier layer is formed from one of a layer of aluminum nitride (AlN) having a thickness of about 1 nm to about 20 nm, a layer of gallium nitride (GaN) having a thickness of about 50 nm to about 200 nm and a layer of gallium nitride (GaN) having a thickness of about 200 nm to about 1000 nm.

9. The circuit of claim 1, wherein the castellated gate contact comprises one of nickel and gold.

10. An integrated circuit comprising:
a single channel device overlying a substrate structure in a single channel device area, the single channel device having a single heterostructure;
a multichannel device overlying the substrate structure in a multichannel device area, the multichannel device having a superlattice structure, and a castellated gate contact that substantially surrounds three sides of one or more multichannel ridges formed in the superlattice structure;
an isolation region in the single heterostructure that electrical isolates the single channel device from the multichannel device; and
source and drain contact regions formed on opposite sides of the gate contacts in each of the single channel and multichannel device regions to create transistors in each region.

11. The circuit of claim 10, wherein trenches are formed in portions of the multichannel structure to create castellated gate contacts.

12. The circuit of claim 11, wherein the castellated gate contacts substantially surround three sides of one or more single channel ridges formed in part by the trenches in the superlattice structure of the multichannel structure.

13. The circuit of claim 10, further comprising a protective layer overlying the single heterostructure in the multichannel device area.

14. The circuit of claim 13, wherein the protective layer electrically isolates the multichannel device from the single heterostructure.

15. The circuit of claim 14, wherein the trenches extend into the protective layer, and wherein the castellated gate contact does not extend into the protective layer.

16. The circuit of claim 10, wherein each of the plurality of heterostructures of the superlattice structure are doped and form channels of the multichannel device.

17. The circuit of claim 10, wherein the single heterostructure is undoped and inoperable and does not form one of the channels of the multichannel device.

18. The circuit of claim 10, wherein the single channel device comprises a planar gate contact overlying the single heterostructure.

19. The circuit of claim 10, wherein a barrier layer is overlying a nucleation layer that is overlying the substrate structure.

20. The circuit of claim 19, wherein the barrier layer is formed from one of a layer of aluminum nitride (AlN) having a thickness of about 1 nm to about 20 nm, a layer of gallium nitride (GaN) having a thickness of about 50 nm to about 200 nm and a layer of gallium nitride (GaN) having a thickness of about 200 nm to about 1000 nm.

* * * * *